(12) United States Patent
Forrest et al.

(10) Patent No.: US 7,179,543 B2
(45) Date of Patent: Feb. 20, 2007

(54) DOPING OF ORGANIC OPTO-ELECTRONIC DEVICES TO EXTEND RELIABILITY

(75) Inventors: Stephen R. Forrest, Princeton, NJ (US); Brian Wendell D'Andrade, Princeton, NJ (US); Anna Chwang, Princeton, NJ (US)

(73) Assignees: The Trustees of Princeton University, Princeton, NJ (US); Universal Display Corporation, Ewing, NJ (US)

( * ) Notice: Subject to any disclaimer, the term of this patent is extended or adjusted under 35 U.S.C. 154(b) by 195 days.

(21) Appl. No.: 10/680,065

(22) Filed: Oct. 6, 2003

(65) Prior Publication Data

US 2005/0074629 A1  Apr. 7, 2005

(51) Int. Cl.
*H01L 51/50* (2006.01)
*H05B 33/14* (2006.01)

(52) U.S. Cl. .................. 428/690; 428/917; 313/504; 313/506

(58) Field of Classification Search .......... 428/690, 428/917; 313/504, 506
See application file for complete search history.

(56) References Cited

U.S. PATENT DOCUMENTS

| | | | |
|---|---|---|---|
| 4,624,862 A | 11/1986 | Yang et al. | |
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,804,322 A | 9/1998 | Shi et al. | |
| 5,834,893 A | 11/1998 | Bulovic et al. | |
| 5,844,363 A | 12/1998 | Gu et al. | |
| 5,989,737 A * | 11/1999 | Xie et al. | 428/690 |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,198,091 B1 | 3/2001 | Forrest et al. | |
| 6,204,514 B1 * | 3/2001 | Koshihara et al. | 257/40 |
| 6,278,055 B1 | 8/2001 | Forrest et al. | |
| 6,294,398 B1 | 9/2001 | Kim et al. | |
| 6,297,495 B1 | 10/2001 | Bulovic et al. | |
| 6,303,238 B1 | 10/2001 | Thompson et al. | |
| 6,333,458 B1 | 12/2001 | Forrest et al. | |
| 6,337,102 B1 | 1/2002 | Forrest et al. | |
| 6,352,777 B1 | 3/2002 | Bulovic et al. | |
| 6,440,769 B2 | 8/2002 | Peumans et al. | |
| 6,451,415 B1 | 9/2002 | Forrest et al. | |
| 6,468,819 B1 | 10/2002 | Kim et al. | |
| 6,891,326 B2 * | 5/2005 | Lu | 313/504 |
| 2002/0105005 A1 * | 8/2002 | Seo et al. | 257/101 |

FOREIGN PATENT DOCUMENTS

WO    WO02/101838    12/2002

OTHER PUBLICATIONS

Baldo et al., "Highly Efficient Phosphorescent Emission from Organic Electroluminescent Devices," Nature, vol. 395, 151-154, 1998, no month given.
Baldo et al., "Very High-Efficiency Green Organic Light-Emitting Devices Based on Electrophosphorescence," Appl. Phys. Lett., vol. 75, No. 3, 4-6 (1999), no month given.
Adachi et al., "Nearly 100% Internal Phosphorescent Efficiency In An Organic Light Emitting Device," J. Appl. Phys., 90, 5048 (2001), no month given.
Parthasarathy et al., "Lithium Doping of Semiconducting Organic Charge Transport Materials," J. Appl. Phys. 89, 4986 (2001), no month given.
Huang et al., "Low-Voltage Organic Electroluminescent Devices Using Pin Structures," Appl. Phys. Lett. 80, 139 (2002), no month given.
U.S. Appl. No. 10/173,682 to Forrest et al., filed on Jun. 18, 2002.
U.S. Appl. No. 09/931,948 to Forrest et al., filed on Aug. 20, 2001.
U.S. Appl. No. 10/233,470 to Shtein et al., filed on Sep. 4, 2002.

* cited by examiner

*Primary Examiner*—Dawn Garrett
(74) *Attorney, Agent, or Firm*—Kenyon & Kenyon LLP

(57) ABSTRACT

The present invention is directed to multi-layer organic devices having improved stability, wherein at least one layer of the device comprises a host material that is morphologically unstable and a dopant material that provides improved morphological properties to the layer. The layer may be incorporated into, for example, OLEDs, organic phototransistors, organic photovoltaic cells, and organic photodetectors.

26 Claims, 10 Drawing Sheets

DOPING OF ORGANIC OPTO-ELECTRONIC DEVICES TO EXTEND RELIABILITY

This invention was made with Government support under Contract No. F33615-94-1-1414 awarded by Defense Advanced Research Projects Agency. The Government has certain rights in this invention.

RESEARCH AGREEMENTS

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to stable organic multilayer devices. More particularly, the invention relates to organic opto-electronic devices having improved stability.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

To be practical, an organic optoelectronic device should have sufficient reliability and operating lifetimes. However, most organic opto-electronic devices reported so far have a short operational lifetime. This instability may be attributed to the deterioration of one or more of the organic layers.

SUMMARY OF THE INVENTION

The present invention relates to stable organic multilayer devices. At least one layer of the organic multilayer device comprises a host material that is morphologically unstable and a dopant material that provides improved morphological properties to the layer. Thus, the present invention relates to an organic layer in an opto-electronic device comprising a host material that is morphologically unstable and a dopant material that enhances the morphological stability of the host material. The dopant material is present in the host material at a concentration of 50% by weight or less. Preferably, the organic layer does not have an emissive function in the device.

In one embodiment, the invention relates to an organic light emitting device comprising an anode, a cathode, a first organic layer disposed between and in electrical connection with the anode and the cathode, wherein the first organic layer is an emissive layer; and a second organic layer disposed between the first organic layer and the cathode or between the first organic layer and the anode. The second organic layer comprises a host material that is morphologically unstable and a dopant material that enhances the morphological stability of the host material. The dopant material is present in the host material at a concentration of 50% by weight or less. In one embodiment, the resulting device has a lifetime that is at least about 25% longer than an analogous device having a second organic layer that does not contain the dopant material. In another embodiment, the host material is a material that becomes at least 20% crystalline after 100 hours at 35° C. when deposited as a initially amorphous this film, and the mixture of the host material and the dopant material does not become more than 10% crystalline after 100 hours at 35° C. when deposited as a initially amorphous this film.

DETAILED DESCRIPTION

Figure 1:
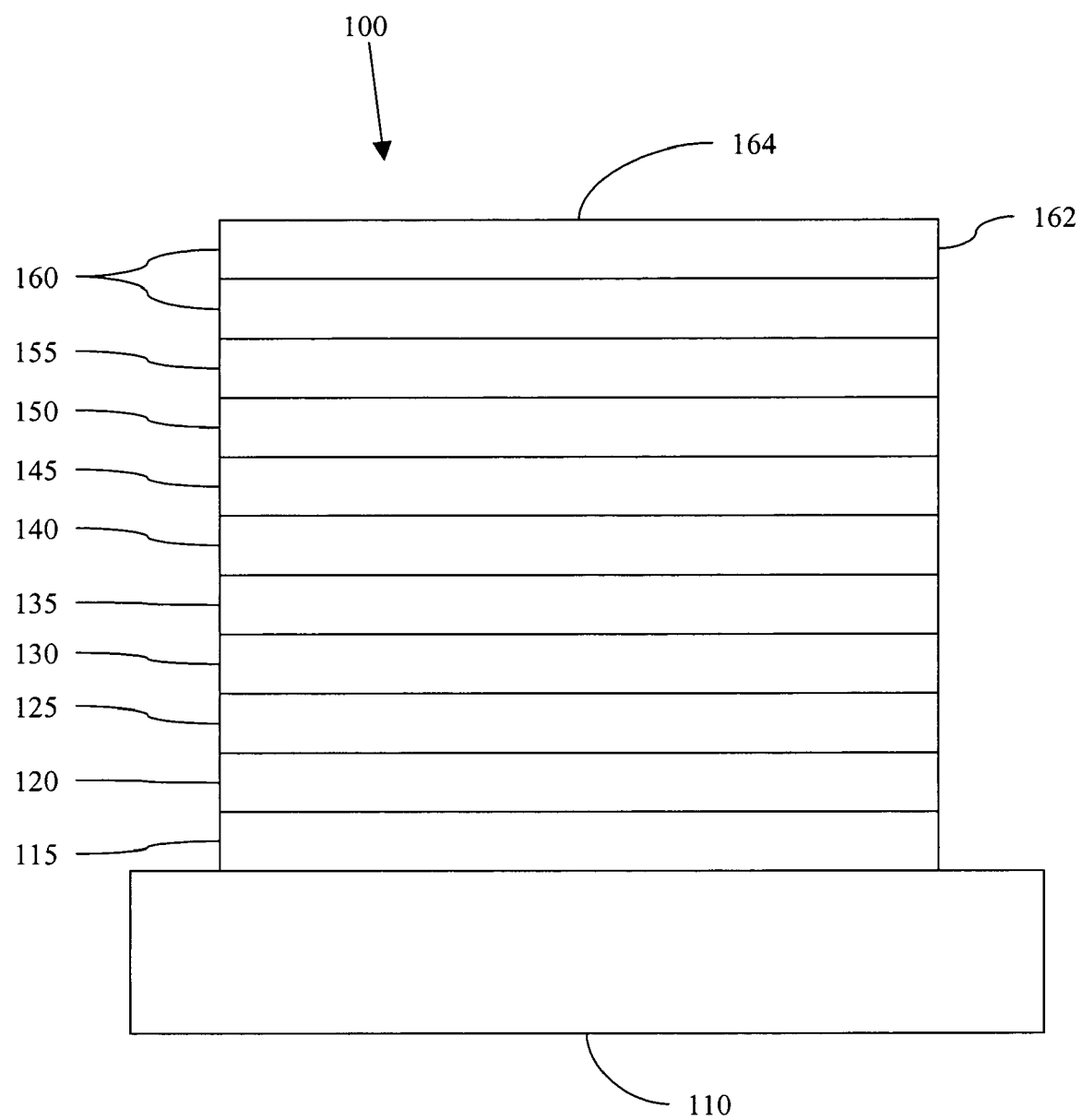
FIG. 1 shows an organic light emitting device having separate electron transport, hole transport, and emissive layers, as well as other layers.

The present invention is directed to multi-layer organic devices having improved stability, wherein at least one layer comprises a host material that is morphologically unstable and a dopant material that provides improved morphological properties to the layer. The present invention may be incorporated into, for example, OLEDs, organic phototransistors, organic photovoltaic cells, and organic photodetectors. In a preferred embodiment, the invention is directed to an OLED.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to nonradiative decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Intrinsic hole transporting materials may be doped to enhance their conductivity. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Intrinsic electron transporting materials may be doped to enhance their conductivity. For example, $Alq_3$ may be doped with Li. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

Blocking layers may be used to prevent electrons and holes from leaving the emissive layer. An electron blocking layer may be disposed between the emissive layer and the p-doped layer, to prevent electrons from passing into the p-doped layer. Preferably, the energy barrier is sufficiently great that even high energy electrons have a small probability of surmounting the barrier. As a result, the energy barrier is preferably significantly higher than the thermal energy.

Similarly, a hole blocking layer may be disposed between the emissive layer and the n-doped layer, to prevent holes from passing onto the n-doped layer. Preferably, the energy barrier is sufficiently great that even high energy holes have a small probability of surmounting the barrier. As a result, the energy barrier is preferably significantly higher than the thermal energy.

Blocking layers may also be used to prevent excitons from diffusing out of the emissive layer. An exciton, which is an electron that has been excited into the conduction band, paired with a hole located on the same organic semiconductor molecule, has an energy that is related to the band gap of the semiconductor. The exciton energy is actually less than the band gap due to Coulombic attraction of the bound electron-hole pair. A material having a particular exciton energy will block the entry of excitons from a material having a lower exciton energy.

Excitons in a material having a particular band gap (the difference between the HOMO and LUMO energy levels) generally have an energy level that is less than that of excitons in a material having a wider band gap. Accordingly, excitons generally may not diffuse from a material having a lower band gap into a material having a higher band gap, and a higher band gap material may be used to block excitons from leaving a lower band gap material.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
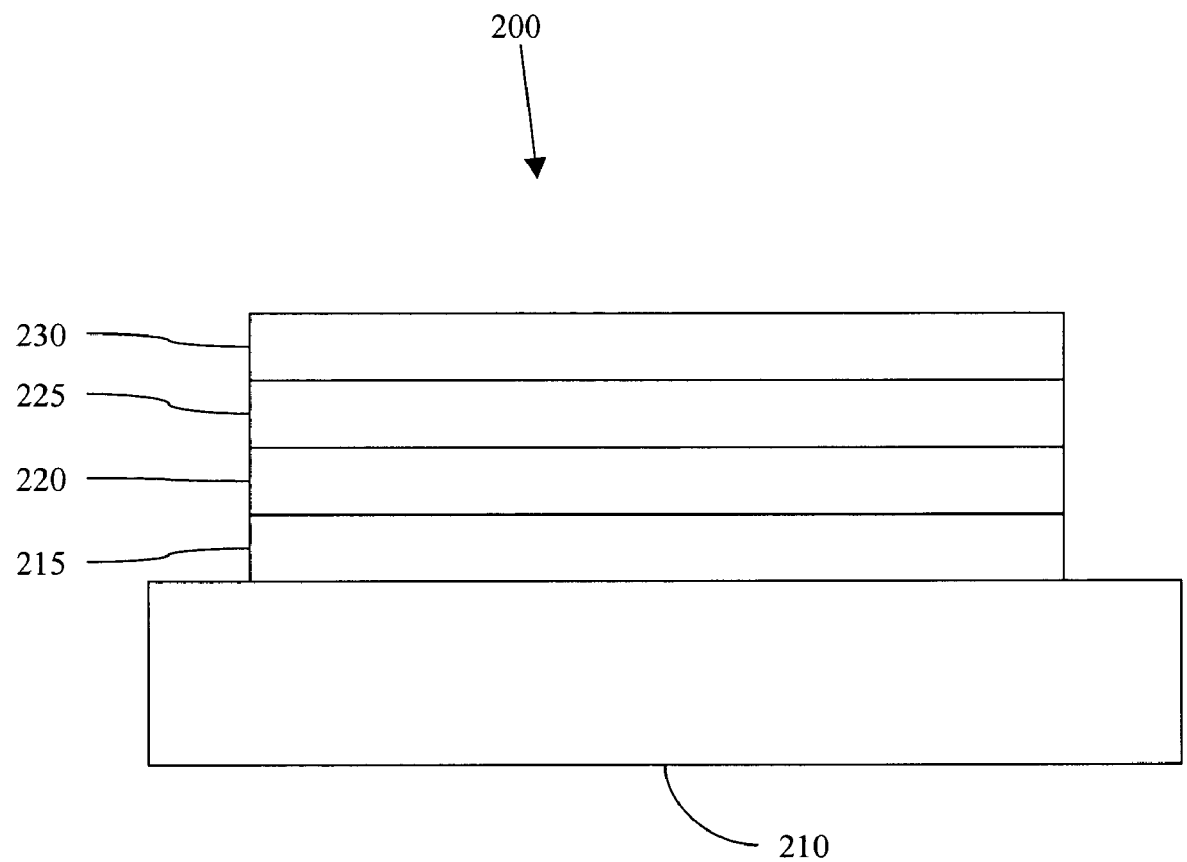
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

Organic photodetectors and photovoltaic devices may be prepared according to the techniques known in the art, for example U.S. Pat. Nos. 6,352,777, 6,297,495, 6,278,055, 6,198,091, 6,451,415, 6,333,458, and 6,440,769 each of which is incorporated herein by reference in its entirety.

The present invention is directed to multi-layer organic devices having improved stability, wherein at least one layer comprises a host material that is morphologically unstable and a dopant material that provides improved morphological properties to the layer.

The host material is a material that is selected for its advantageous electronic properties. For example, the host material may be, for example, a charge conducting material (an electron transporting material or a hole transporting material), a blocking material (hole blocking, electron blocking, and/or exciton blocking). The layer that comprises the host material does not function as an emissive layer in the device.

The host materials contemplated herein are morphologically unstable, particularly when deposited as a pure material in a thin film. The term morphologically unstable refers to the property of a material wherein the morphological characteristics of the material change during the lifetime of the device leading to a decrease in device efficiency or device failure. For example, a layer of the host material may be deposited as an amorphous thin film. Over the lifetime of the device, the morphologically unstable host may crystallize or form grain boundaries which may result in a decrease in device efficiency or device failure. The term stability may also imply that a material property does not change over the normal operating temperatures of the device.

The stability-enhancing dopant is an organic material that is different from the host material. The stability-enhancing dopant material is selected to provide improved morphological stability to the host material. Additionally, the stability-enhancing dopant material and its concentration are selected so as to not substantially effect the electronic properties of the layer of the host material. The stability-enhancing dopant needs to be present above a minimum concentration in order to effect the morphological stability of the host layer. Conversely, the dopant should not be the major component of the layer, as the electronic properties of the layer may be effected. Thus, the stability-enhancing dopant is doped into the host material at a concentration of not more than 50%. In a preferred embodiment, the stability-enhancing dopant is doped into the host material at a concentration of about 1% to about 45%. In a particularly preferred embodiment, the stability-enhancing dopant is doped into the host material at a concentration of about 5% to about 40%. As used herein, the % concentration is by weight unless otherwise indicated.

In one embodiment of the invention, the morphological stability of the host is quantified using the glass transition temperature, $T_g$. In this embodiment, morphological stability can be inferred from the $T_g$ of the host material. A host material with a low $T_g$ may be morphologically unstable when used undoped in a thin film. An organic thin film changes from a glassy (amorphous) state to a crystalline state near its $T_g$, so a device operating at a temperature near or above the $T_g$ of one its organic layers is likely to be unstable. Generally, if the operating temperature of the device is within about 10° C. of the $T_g$ of the pure host material, some crystallization of the host material may occur. The operating temperature of organic opto-electronic devices may be about 45–50° C., and as high as about 100° C. Thus, this embodiment of the invention would relate to host materials having a $T_g$ not higher than about 10° C. above the operating temperature of the device. Typically, the morphologically unstable host materials according to this embodiment of the invention would have a $T_g$ of less than about 70° C. In one embodiment, a morphologically unstable host material may be stabilized by mixing it with one or more materials having a higher $T_g$. The resulting stabilized layer should have a sufficiently high $T_g$ so that crystallization does not occur for a device having a given operating temperature. It is preferable that the stability enhancing dopant has a $T_g$ above about 90° C., and that the stabilized layer has a resulting $T_g$ above about 80° C. For example, BPhen, with a $T_g$ of 62° C., may be doped with BAlq, which has a $T_g$ of 92° C.

In another embodiment of the invention, the morphological stability of the host is quantified by the relative lifetime of the device wherein the subject layer has a stability-enhancing dopant in comparison to an identical device wherein the subject layer does not contain the stability enhancing dopant. The devices being compared differ only in that the subject layer of the first device comprises the morphologically unstable host and the stability-enhancing dopant (the "stability-enhanced device") and the second device comprises the morphologically unstable host material but does not contain the stability-enhancing dopant (the "reference device"). In a preferred embodiment, the lifetime of the stability-enhanced device is improved by greater than about 25% in comparison to the reference device. In a particularly preferred embodiment, the lifetime of the stability-enhanced device is improved by greater than about 40% in comparison to the reference device.

In another embodiment of the invention, the morphological stability of the subject layer is quantified by comparing the morphological characteristics (such as, form, structure, surface, shape, etc.) of a thin film comprising a morphologically unstable host and stability-enhancing dopant in comparison to an identical thin film that does not contain the stability enhancing dopant. The layers being compared differ only in that the first layer comprises a morphologically unstable host and a stability-enhancing dopant (the "stability-enhanced layer") and the second layer comprises a morphologically unstable host material but does not contain a stability-enhancing dopant (the "reference layer"). When observed under a microscope, the a thin layer of a morphologically unstable host material should initially show few visible defects, such as crystalline structures. The layer is stored for a period of time at a temperature between room temperature and about 70° C. After the period of storage, the thin layer of a morphologically unstable host material may show visible defects. The temperature of storage may be selected to coincide with the approximate operating temperature of a particular opto-electronic device. A stability-enhanced layer will show fewer defects in comparison to the reference layer when exposed to the same conditions. Thus, in one embodiment, an initially amorphous thin layer of a morphologically unstable host material becomes at least about 20% (by area) crystalline after 100 hours at 35° C. In comparison, an initially amorphous thin layer of the morphologically unstable host and a stability-enhancing dopant does not turn more than about 10% crystalline after 100 hours at 35° C.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
Ir(ppy)$_3$: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: naphthyl-phenyl-diamine
TPD: N,N=-bis(3-methylphenyl)-N,N=-bis-(phenyl)-benzidine
BAlq: aluminum(III)bis(2-methyl-8-quinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)

Experimental

Specific representative embodiments of the invention will now be described, including how such embodiments may be made. It is understood that the specific methods, materials, conditions, process parameters, apparatus and the like do not necessarily limit the scope of the invention.

Device Fabrication

OLEDs are fabricated on patterned, solvent cleaned and ultraviolet-ozone treated 1500 Å thick indium tin oxide (ITO) coated glass substrates. All organic layers were sequentially deposited by high-vacuum ($10^{-7}$ Torr) thermal evaporation. For p-i-n devices, BPhen was n-type doped with Li in a 1:1 molar ratio, and 4,4',4"-tris(3-methylphenylphenylamino) triphenylamino (MTDATA) was p-type doped at 2 mol. % with 2,3,5,6-tetrafluoro-7,7,8,8-tetracyanoquinodimethane ($F_4$-TCNQ). Cathodes consisting of either Al or lithium fluoride/Al were deposited through shadow masks. The masks were attached to the substrates in an oxygen and water-free (<2-ppm) glove box, which was connected via a load lock to the vacuum deposition system. The active area of a device is 5 mm². Devices were encapsulated in a glass-to-glass based epoxy sealed package with desiccant incorporated into the non-active area, and they were driven by a constant dc current starting at an initial luminance of 600 cd/m². The device operational half-life, $t_{1/2}$, is defined as the time for the luminance to decrease to half its initial value (300 cd/m²).

EXAMPLE 1

Figure 3:
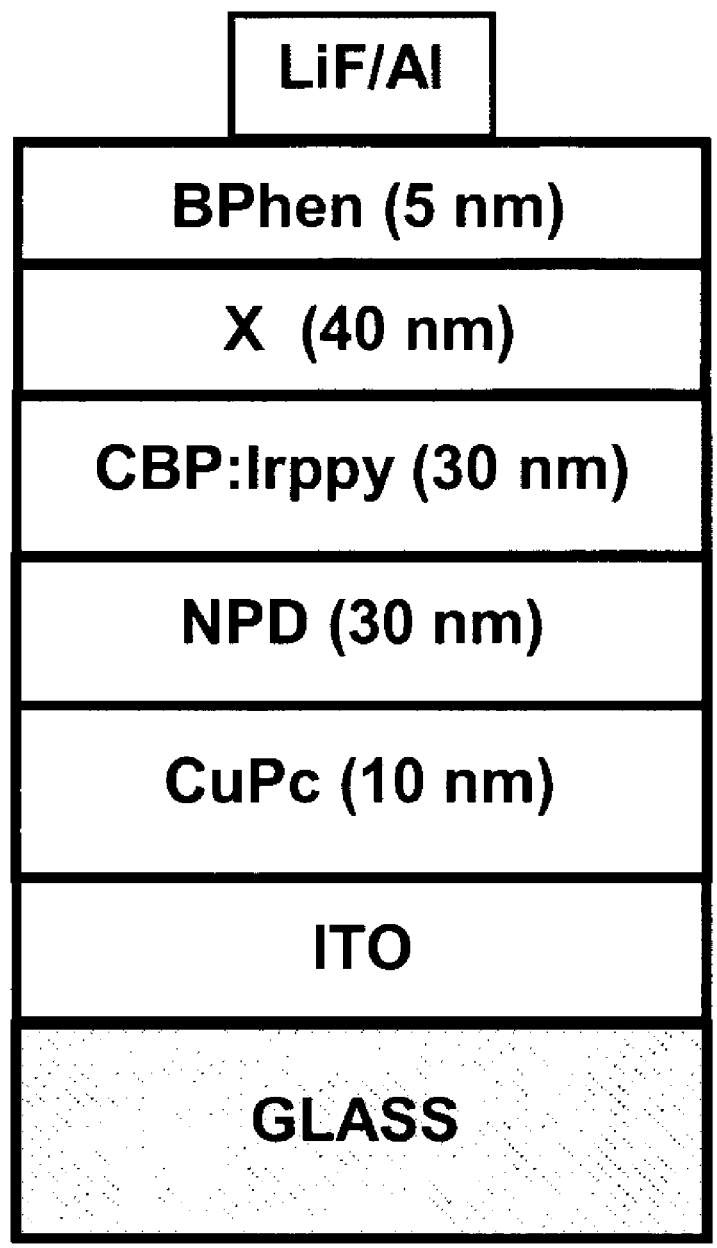
FIG. 3 shows a schematic structure of the devices used to examine the effects of mixed BPhen:Balq hole blocking layers, wherein X represents the host layer.

OLEDs were prepared with the device structure ITO/CuPc (10 nm)/NPD (30 nm)/CBP:Irppy (5 nm, 6%)/X/BPhen (5 nm)/LiF/Al. The device structure is shown in FIG. 3. The HBL (X) consisted of either BAlq, or 25 wt. % BPhen in BAlq, or 50 wt. % BPhen in BAlq. The copper phthalocyanine (CuPc) layer improves hole injection into the 4,4'-bis[N-(1-nathyl)-N-phenyl-amino]biphenyl (NPD) hole transport layer, and fac-tris(2-phenylpyridine) iridium (Irppy) was doped at 6 wt. % into a 4,4'-N,N'-dicarbazole-biphenyl (CBP) host.

Figure 4:
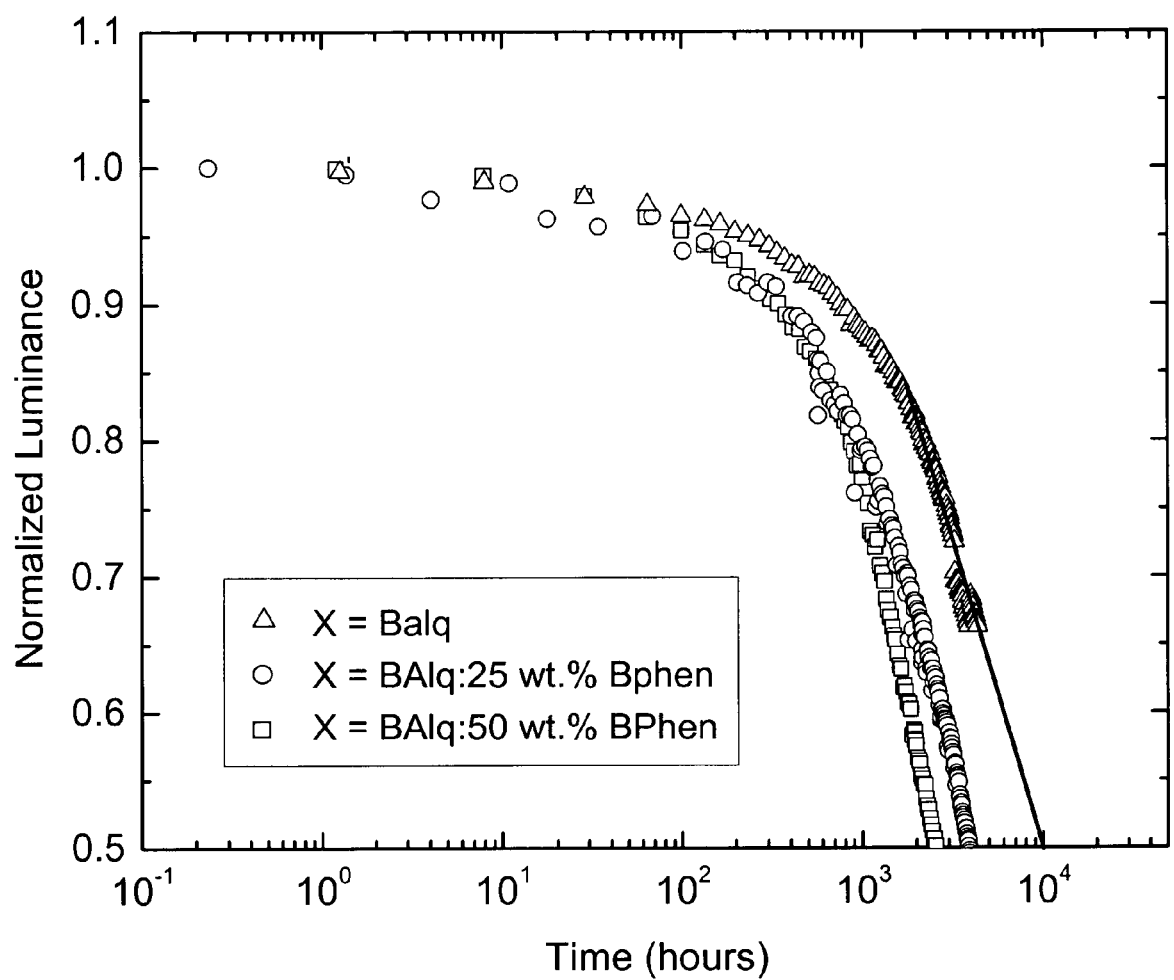
FIG. 4 shows plots of the normalized luminance at constant dc drive current versus time data for devices of FIG. 3 with varying concentrations of BPhen mixed with BAlq.

The normalized luminance versus time characteristics of devices with the various mixtures of BAlq and BPhen is shown in FIG. 4. Device stability decreases as the concentration of BPhen is varied from 0 wt. % to 50 wt. %. Devices with X=BAlq, 25 wt. % BPhen:BAlq, and 50 wt. % BPhen:BAlq have $t_{1/2}$=3900 hrs and 2600 hrs, respectively, and from an extrapolation of the curve to half the initial luminance (solid line) $t_{1/2}$=10,000 hrs when X=BAlq. Normalized to $L_0$=100 cd/m², the lifetimes are $t_{1/2}$=60,000 hrs, 23,000 hrs and 16,000 hrs, assuming an inverse relationship between half-life and initial luminance.

The $T_g$ of the HBL is tuned by mixing two materials. The decrease in stability of the devices with increasing concentration of BPhen can be attributed to the lowering of the $T_g$ of the HBL. The $T_g$ of the HBL is varied by mixing two materials, where $$\frac{1}{T_g} = \frac{w_{BPhen}}{T_{g,BPhen}} + \frac{w_{BAlq}}{T_{g,BAlq}} \quad (1)$$

Here, $w_{BPhen}$ and $w_{BAlq}$ are the weight fractions of BPhen and BAlq. The $T_g$ of BAlq and BPhen are found to be 92° C. and 62° C., respectively. Therefore, according to Eq. (1) the $T_g$ of the mixed HBLs are 92° C., 84° C., and 76° C. for 0 wt %, 25 wt. %, and 50 wt. % BPhen, respectively. Morphological, and hence device stability, is expected to decrease with BPhen concentration, as observed.

Figure 5:
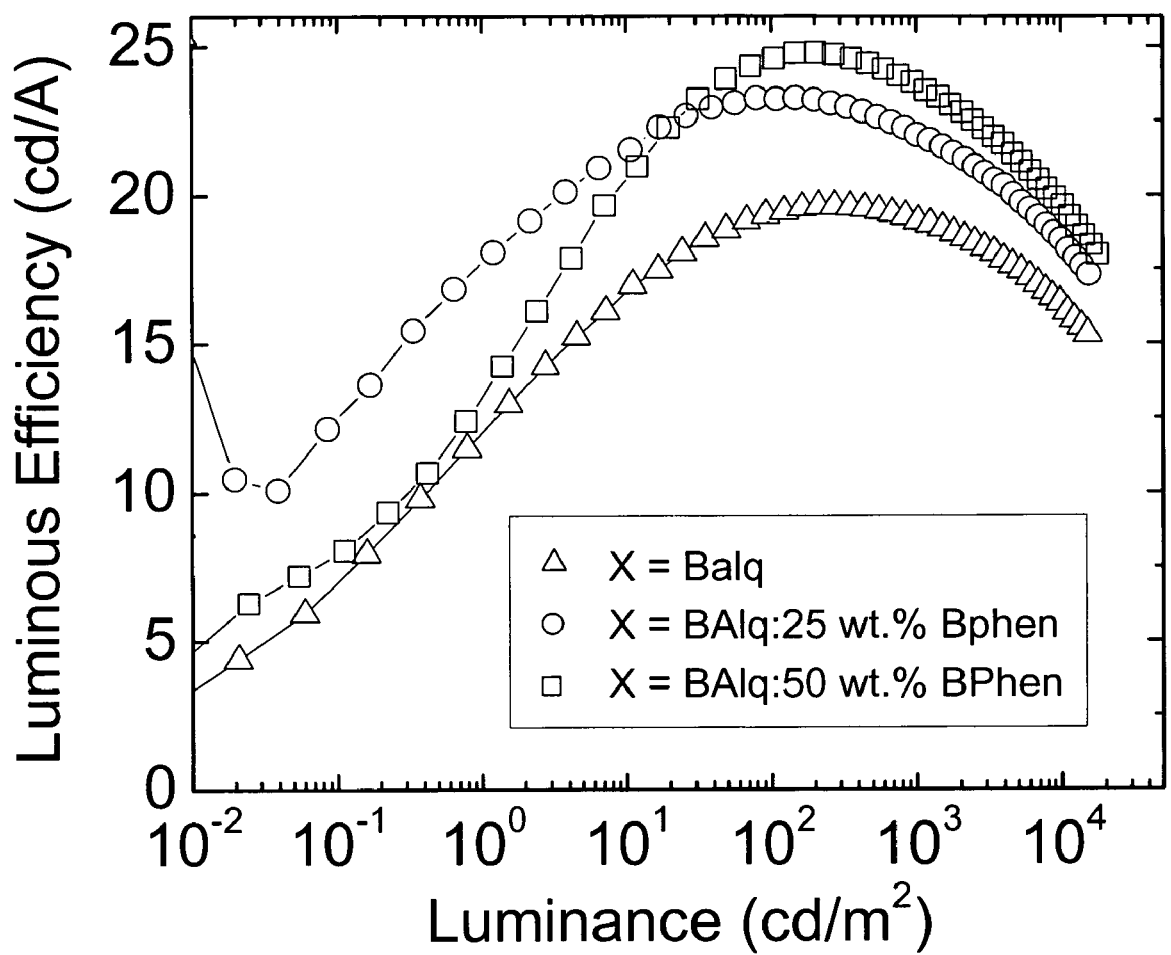
FIG. 5 shows the luminous efficiency versus luminance for devices with varying mixtures of BPhen:BAlq.

The trend in the stability is opposite to the trend in the initial efficiency, which increases with the concentration of BPhen as shown in the left inset of FIG. 5. Peak efficiencies are 19.6 cd/A, 23.2 cd/A and 24.8 cd/A at ~20 cd/m², and there are roll offs in the efficiency at both low and high current densities, as seen in other electrophosphorescent devices.

The increase in efficiency for higher concentrations of BPhen can be understood by examining the energies of the highest occupied molecular orbital (HOMO) of BPhen versus BAlq. Ultraviolet photoemission studies have shown that a 0.4 eV hole potential energy barrier exist at the interface of CBP and bathocuproine (BCP). A similar energy barrier does not exist between CBP and BAlq. With respect to the vacuum level, the HOMO energy of CBP and BAlq is 6.0 eV and 5.5 eV, respectively. It may be the case that the emissive material Irppy is the primary hole carrier in the emissive layer. The HOMO of Irppy is 5.0–5.3 eV. In either case, holes are more effectively blocked at the EML/BPhen interface than at the EML/BAlq interface. The mixture of BPhen and BAlq possibly creates an interface with an intermediate hole blocking ability between that of the two materials, so the improvement in the confinement of holes within the EML, as the BPhen concentration increases, enhances the quantum efficiency of the device.

The current density versus voltage (J-V) characteristics are similar for all three devices, indicating that the HBL does not limit the layer conductivity, regardless of BPhen-to-BAlq composition. Therefore, it may be inferred that changes in luminous power efficiency ($\eta_p$) reflect the changes in luminous efficiency of the devices, where $\eta_p$ increases with BPhen concentration. At 100 cd/m², $\eta_p$=9.6 lm/W, 11.7 lm/W and 12.4 lm/W for BPhen concentrations of 0 wt. %, 25 wt. % and 50 wt. %, respectively.

Figure 6:
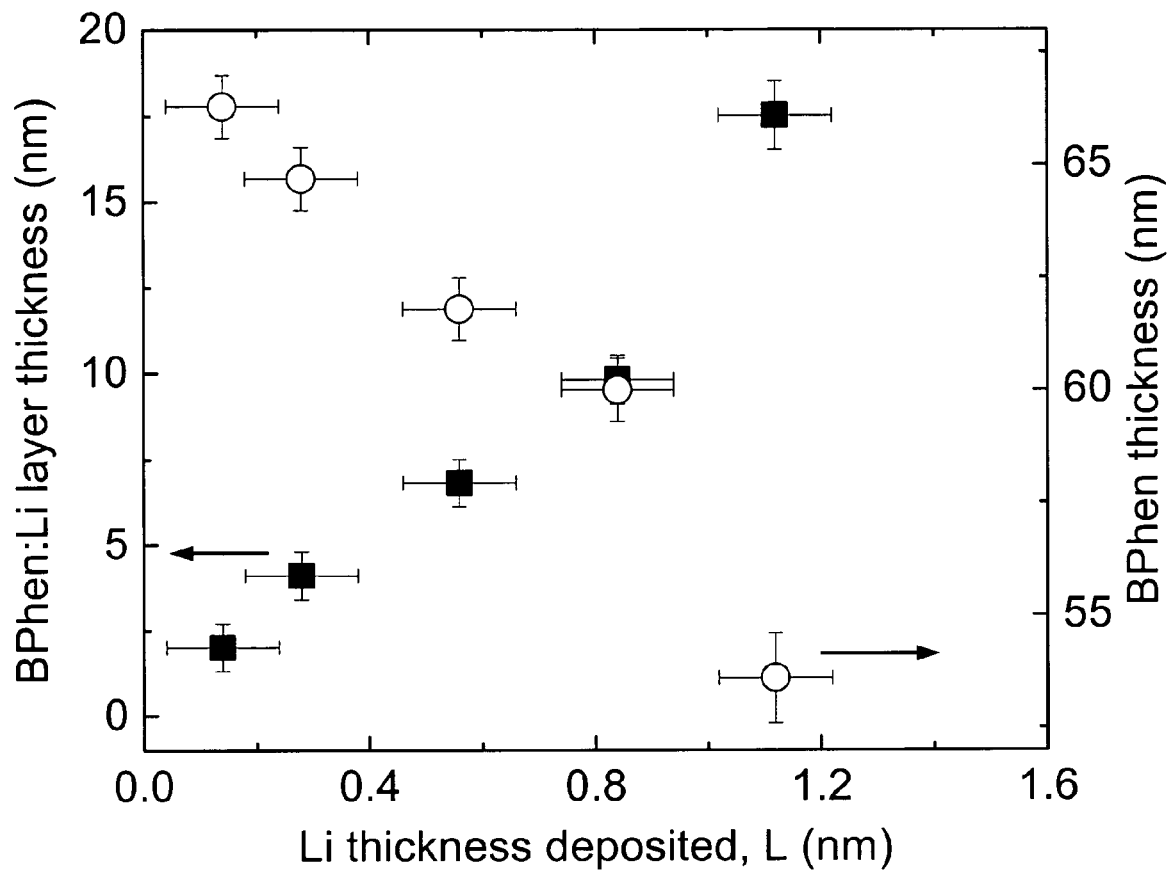
FIG. 6 shows the plots of the thickness of BPhen:Li and BPhen layers versus thickness (L) of deposited Li, determined from ellipsometry. Below: Schematic diagram of the structure grown to determine Li penetration depth into a neat 68-nm-thick BPhen layer.
Figure 6:
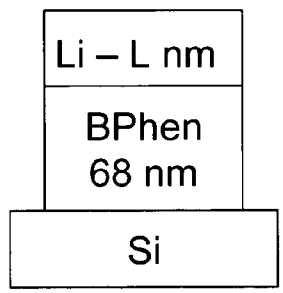

Lithium atoms can act as emission quenching sites in the EML, hence it is important to determine how far they diffuse toward this layer. Since BPhen and Li react to form a complex with optical properties that are different from BPhen, ellipsometry was used to gain quantitative insight into the penetration of Li into BPhen. Pure Li layers of various thickness (L nm) were deposited onto neat films of BPhen, which were grown on Si substrates as shown in the FIG. 6, with the Li subsequently diffusing into the BPhen, forming BPhen:Li complexes.

From ellipsometric analysis, it is determined that a 0.15 nm thick layer of Li penetrates 2 nm into BPhen. Here, a three-layer ellipsometric model describing the final structure consists of the Si substrate, BPhen and BPhen:Li organic layers (schematic structure of FIG. 6). The refractive indices and absorbance of BPhen (n=1.70) and BPhen:Li (n=1.65) were found independently, so the thickness of the organic layers in the three layer structure were the only fitting parameters in the model. The penetration depth increases with Li thickness, extending 17.5 run into BPhen when 1.1 nm of Li is deposited. The error in the measurement increases as more unreacted Li remains on the surface of the film when thicker Li layers are deposited, because the ellipsometric model does not include the presence of this metallic layer. Note, that the Li does not completely penetrate the 68 nm-thick BPhen layer, although previous reports employing secondary ion mass spectroscopy (SIMS) would suggest otherwise (G. Parthasarathy, C. Shen, A. Kahn and S. R. Forrest, J. Appl. Phys. 89, 4986 (2001)). This difference is attributed to artifacts of SIMS such as recoil mixing, which broadens the measured diffusion profile, and to the deposition of the Ag cap onto Li in the previous studies, which would provide an additional driving force for Li into the organic layer. Also, spectroscopic ellipsometry may be underestimating the thickness of the doped region for several reasons: abrupt interfaces are assumed, and the BPhen:Li layer composition may differ from the assumed 1:1 molar ratio across the entire doped region.

Following these results, in a second set of devices (FIG. 7) a cathode consisting of a layer of BPhen:Li capped by an Al electrode was employed. In such a device, the electrically undoped HBL (layer X) is 40 nm thick with <2 Å Li co-evaporated with BPhen on its surface. Significant Li penetration, implied from FIG. 6, suggests that the thickness of the undoped HBL is less than the BPhen thickness, as determined using a crystal thickness monitor during growth, contributing to a low operating voltage.

Figure 7:
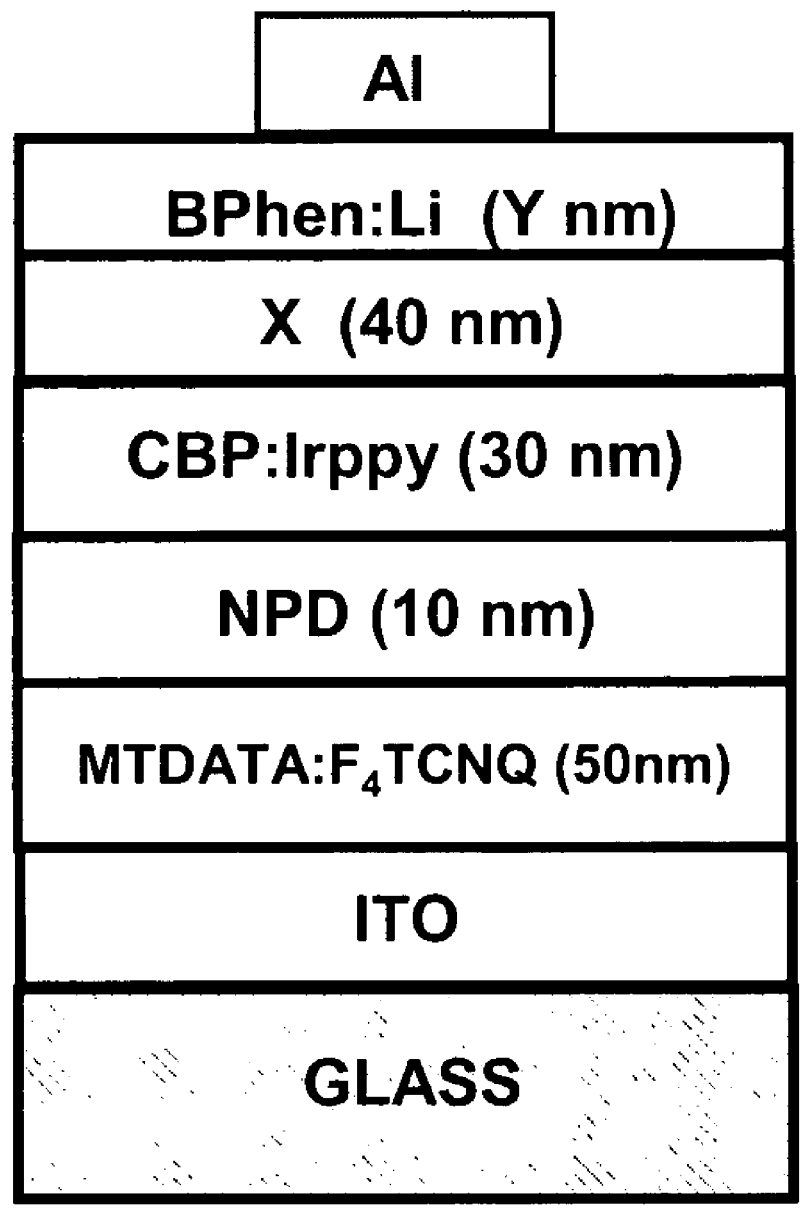
FIG. 7 shows a schematic structure of a p-i-n devices of with hole blocking layers comprised of mixtures of BAlq and BPhen (X), and various thickness (Y) of the n-doped BPhen layer.
Figure 8:
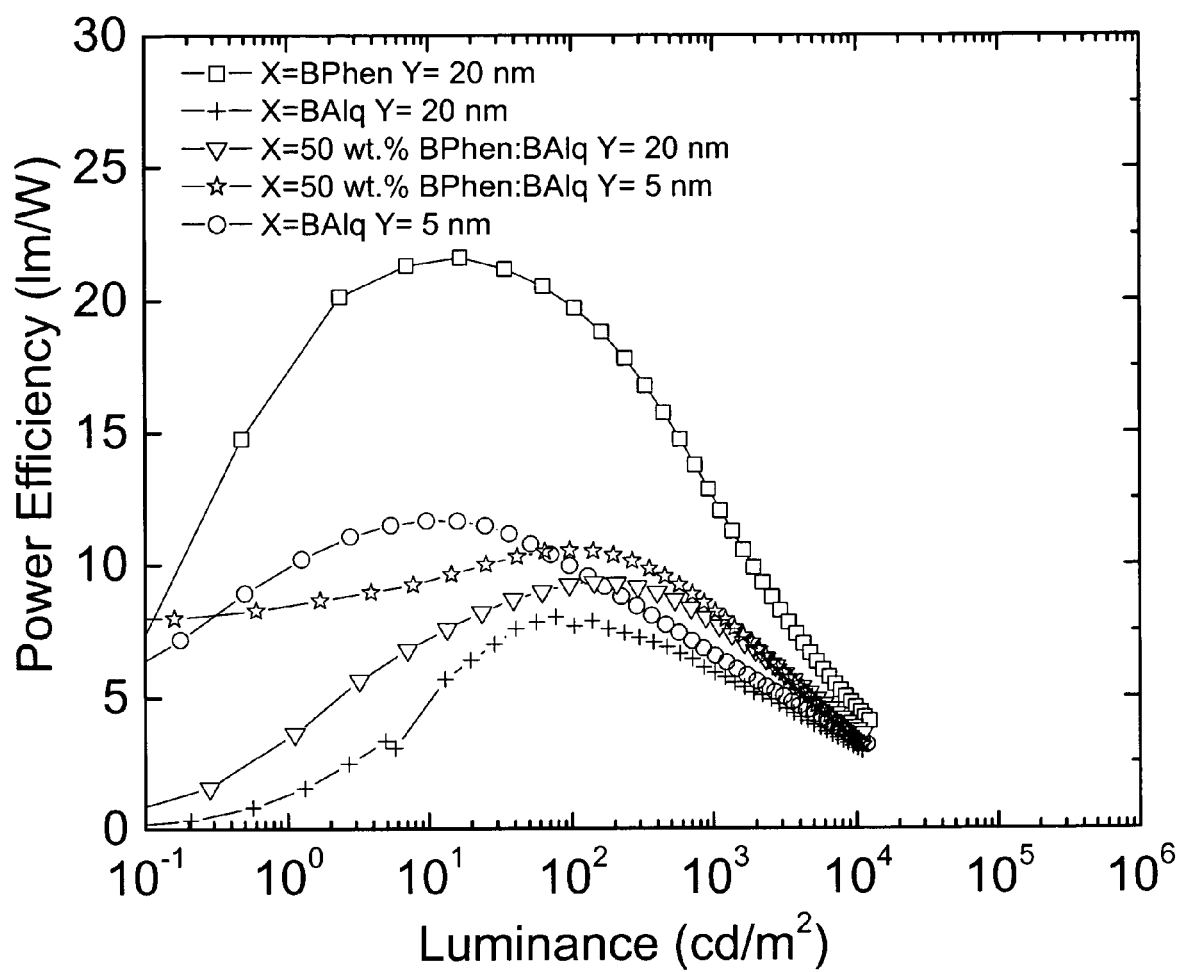
FIG. 8 shows the plots of power efficiency versus luminance of the p-i-n devices of FIG. 7 with hole blocking layers comprised of mixtures of BAlq and BPhen, and various thickness of the n-doped BPhen layer.

The mixed HBL with thickness (Y) of the n-doped layer was varied in the p-i-n OLEDs of FIG. 7. The 30 nm thick EML consisted of CBP doped at 8 wt. % Ir(ppy)$_3$, and a 10 nm thick NPD layer was inserted between the EML and MTDATA to prevent the diffusion of F$_4$-TCNQ into the EML. For devices with the same thickness, Y, $\eta_p$ is generally higher for a higher concentration of BPhen in the HBL. When Y=5 nm, the peak $\eta_p$ occurs at L>100 cd/m$^2$ for X=50 wt. % BPhen:BAlq HBL (stars), and L<50 cd/m$^2$ when X=BAlq (crosses) (FIG. 8).

Figure 10:
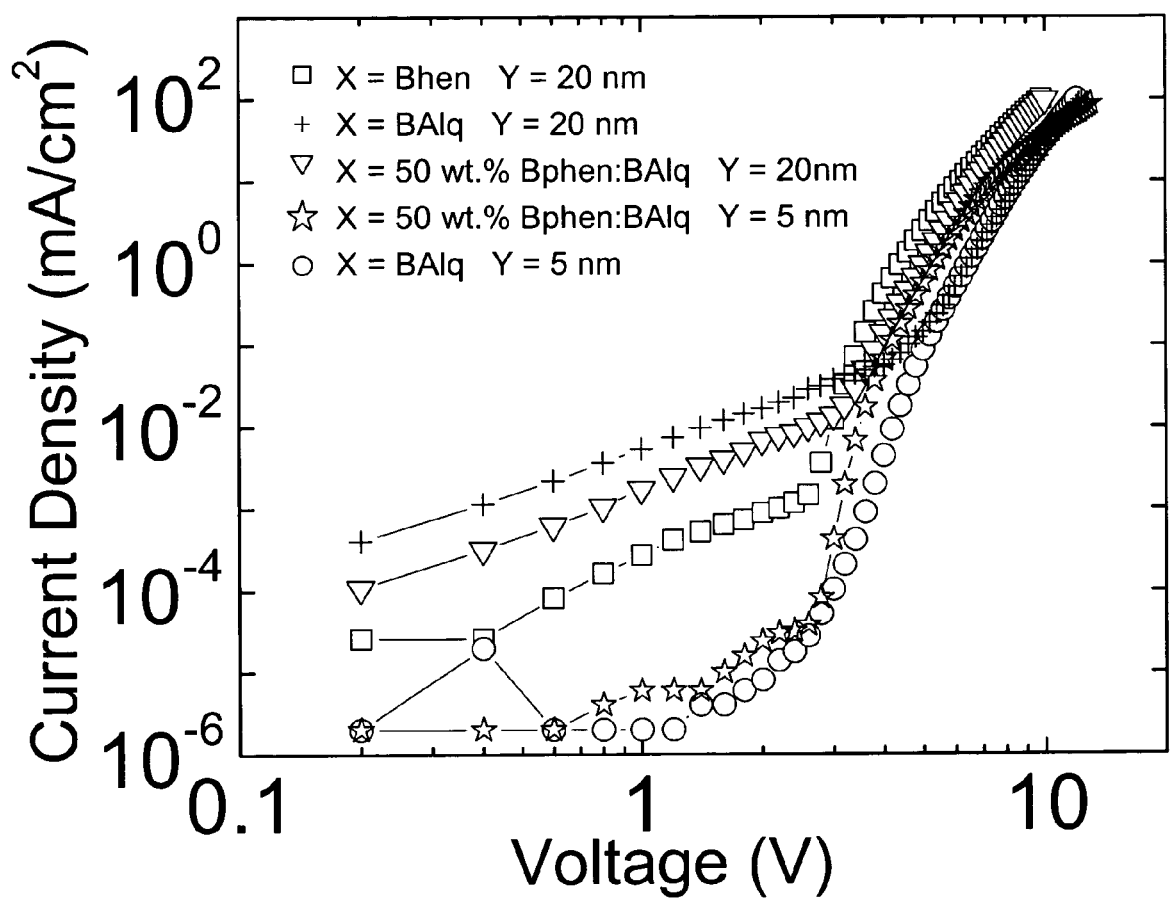
FIG. 10 shows the current density versus voltage characteristics of p-i-n OLEDs.

Below ~1,000 cd/m$^2$, devices with similar HBL compositions show an inverse relationship between Y and $\eta_p$. This trend can be explained by larger lateral leakage currents from devices that have Y=20 nm compared with those with Y=5 nm. In FIG. 10, the J-V characteristics for devices with X=BAlq or 50 wt. % BPhen:BAlq and Y=20 nm show a significantly higher leakage current below 5 V than for similar devices with Y=5 nm. N-doped BPhen layers are five orders of magnitude more conductive than pure organic layers (J. S. Huang, M. Pfeiffer, A. Werner, J. Blochwitz, K. Leo and S. Y. Liu, Appl. Phys. Lett. 80, 139 (2002)) and can be grown>1,600 Å thick without any significant change in the OLED operating voltage. Lateral shunts are probably formed when Y=20 nm, but discontinuities in thinner may prevent this occurrence.

The current density is higher at a given voltage for devices with higher concentrations of BPhen. For example, a device with X=BAlq and Y=5 nm operates at 8.6 V at J=10 mA/cm$^2$, and is reduced to 7.1 V and 6.1 V when X=50 wt. % BPhen:BAlq and X=BPhen, respectively. This decrease in voltage is due to the diffusion of Li through BPhen, effectively reducing the thickness of the undoped HBL. Only the BPhen:Li interaction reduces the conductivity of the HBL, since the conductivity of Li doped BAlq is not increased.

Figure 9:
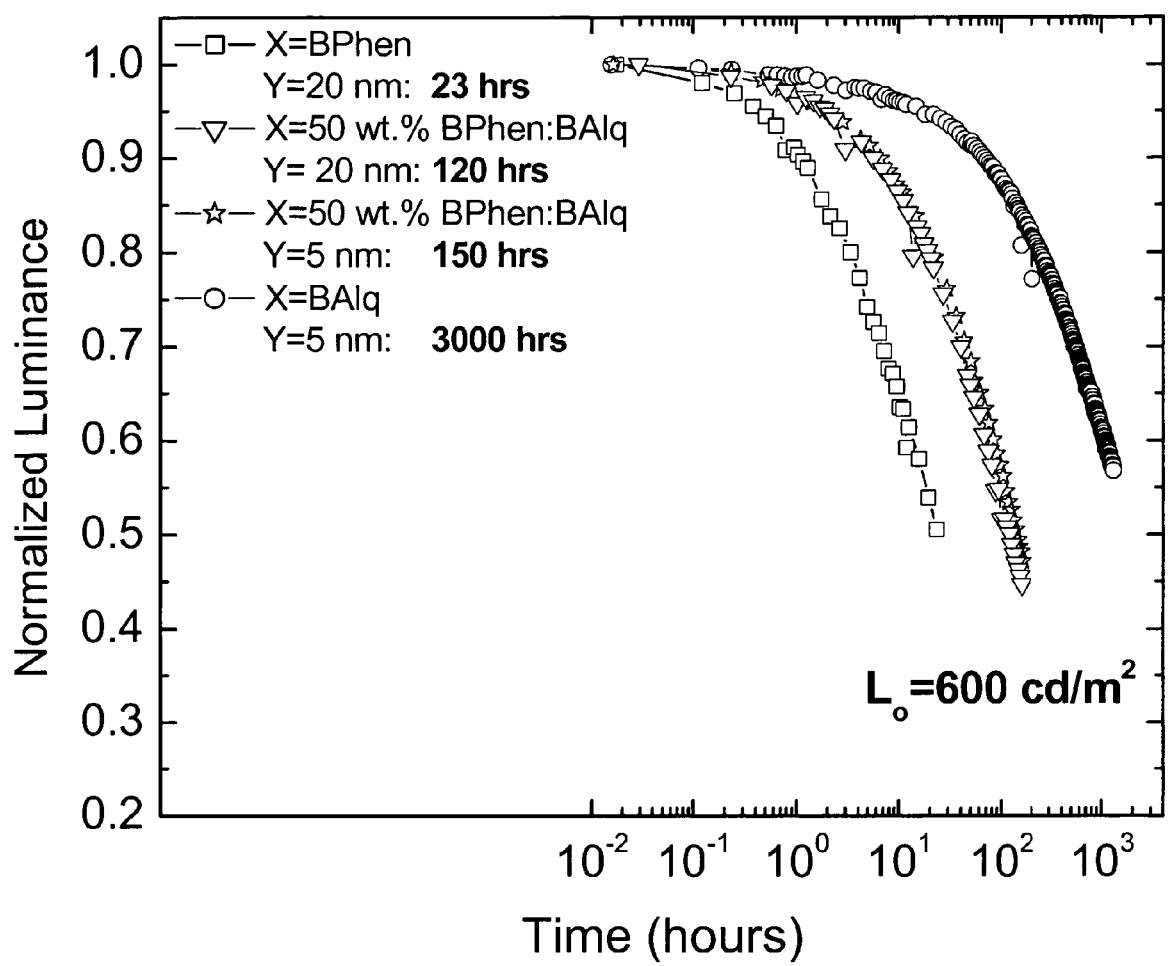
FIG. 9 shows the plot of the normalized luminance versus time characteristics of devices shown in FIG. 7. The operational lifetimes for p-i-n OLEDs having an initial luminance $L_o=600$ cd/m$^2$ are shown.

Stability of p-i-n OLEDs are shown in FIG. 9, indicating a decrease in operational lifetime with increasing BPhen concentration. Here, $t_{1/2}$=23 hrs, 120 hrs and 3,000 hrs for X=BPhen, 50 wt. % BPhen:BAlq, and BAlq, respectively. The OLED with X=BAlq shows a 3.3 times reduction in $t_{1/2}$ compared with that of devices without p and n doped regions, suggesting that significant degradation is caused when p and n-conducting dopants are used. Nevertheless, the instability of undoped BPhen in the HBL remains a major degradation pathway in p-i-n structures.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic layer in an opto-electronic device comprising:
    a host material that is morphologically unstable, the host material comprising a hole blocking material or an exciton blocking material; and
    a dopant material that enhances the morphological stability of the host material,
wherein the dopant material is present in the host material at a concentration of 50% by weight or less, and wherein the organic layer does not have an emissive function in the device.

2. The organic layer of claim 1, wherein the host material is a hole blocking material.

3. The organic layer of claim 1 that is incorporated into an organic light emitting device.

4. The organic layer of claim 1, wherein the dopant material is present in the host material at a concentration of about 1% to about 45%.

5. The organic layer of claim 1, wherein the dopant material is present in the host material at a concentration of about 5% to about 40%.

6. The organic layer of claim 1, wherein the host material has a glass transition temperature less than about 70° C.

7. The organic layer of claim 6, wherein the dopant material has a glass transition temperature above 90° C.

8. The organic layer of claim 7, wherein the organic layer has a glass transition temperature above 80° C.

9. The organic layer of claim 1 wherein the host material comprises a small molecule material.

10. The organic layer of claim 1 wherein the host material comprises a polymeric material.

11. The organic layer of claim 1, wherein the host blocking material is an exciton blocking material.

12. An organic light emitting device comprising
an anode;
a cathode;
a first organic layer disposed between and in electrical connection with the anode and the cathode, wherein the first organic layer is an emissive layer; and
a second organic layer disposed between the first organic layer and the cathode or between the first organic layer and the anode, wherein the second organic layer is a blocking layer,
wherein the second organic layer comprises:
a host material that is morphologically unstable; and
a dopant material that enhances the morphological stability of the host material,
wherein the dopant material is present in the host material at a concentration of 50% by weight or less, and
wherein the device has a lifetime that is at least about 25% longer than an analogous device having a second organic layer that does not contain the dopant material.

13. The organic light emitting device of claim 12, wherein the second organic layer is a hole blocking layer.

14. The organic light emitting device of claim 12, wherein the host material is Bphen and the dopant material is BAlq.

15. The organic light emitting device of claim 12, wherein the dopant material is present in the host material at a concentration of about 1% to about 45%.

16. The organic light emitting device of claim 15, wherein the dopant material is present in the host material at a concentration of about 5% to about 40%.

17. The organic light emitting device of claim 12, wherein the host material has a glass transition temperature of that is below 70° C.

18. The organic layer of claim 17, wherein the dopant material has a glass transition temperature above 90° C.

19. The organic light emitting device of claim 18, wherein the second organic layer has a glass transition temperature above 80° C.

20. The organic light emitting device of claim 12, wherein the second organic layer is an exciton blocking layer.

21. The organic light emitting device of claim 12, wherein the second organic layer is disposed between the first organic layer and the anode, and wherein the second organic layer is an electron blocking layer.

22. An organic light emitting device comprising:
an anode;
a cathode;
a first organic layer disposed between and in electrical connection with the anode and the cathode, wherein the first organic layer is an emissive layer; and
a second organic layer disposed between the first organic layer and the cathode or between the first organic layer and the anode,
wherein the second organic layer comprises:
a mixture of a host material that is morphologically unstable, and a dopant material that enhances the morphological stability of the host material,
wherein the dopant material is present in the host material at a concentration of 50% by weight or less,
the host material is a hole blocking material or an exciton blocking material that becomes at least 20% crystalline after 100 hours at 35° C. when deposited as a initially amorphous this film, and
the mixture of the host material and the dopant material does not become more than 10% crystalline after 100 hours at 35° C. when deposited as a initially amorphous this film.

23. An organic light emitting device comprising:
an anode;
a cathode;
a first organic layer disposed between and in electrical contact with the anode and the cathode, wherein the first organic layer is an emissive layer;
a second organic layer disposed between the first organic layer and the cathode or between the first organic layer and the anode, wherein the second organic layer is a hole blocking layer or an exciton blocking layer disposed adjacent to the first organic layer, the second organic layer comprising:
a mixture of a host material that is morphologically unstable, and a dopant material that enhances the morphological stability of the host material,
wherein the dopant material is present in the host material at a concentration of 50% by weight or less.

24. The organic light emitting device of claim 23, wherein the second organic layer is a hole blocking layer.

25. The organic light emitting device of claim 23, wherein the second organic layer is an exciton blocking layer.

26. An organic layer in an opto-electronic device comprising:
a host material that is morphologically unstable, the host material comprising a polymeric material; and
a dopant material that enhances the morphological stability of the host material,
wherein the dopant material is present in the host material at a concentration of 50% by weight or less, and wherein the organic layer does not have an emissive function in the device.

* * * * *